(12) United States Patent
Kim et al.

(10) Patent No.: US 9,459,391 B2
(45) Date of Patent: Oct. 4, 2016

(54) OPTICAL PRINTED CIRCUIT BOARD AND METHOD FOR MANUFACTURING THE SAME

(75) Inventors: Jae Beum Kim, Seoul (KR); Ki Do Chun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 165 days.

(21) Appl. No.: 13/878,326

(22) PCT Filed: Oct. 5, 2011

(86) PCT No.: PCT/KR2011/007378
§ 371 (c)(1),
(2), (4) Date: Jul. 5, 2013

(87) PCT Pub. No.: WO2012/047024
PCT Pub. Date: Apr. 12, 2012

(65) Prior Publication Data
US 2013/0286676 A1    Oct. 31, 2013

(30) Foreign Application Priority Data
Oct. 6, 2010    (KR) ........................ 10-2010-0097472

(51) Int. Cl.
| G02B 6/12 | (2006.01) |
| G02B 6/10 | (2006.01) |
| G02B 6/42 | (2006.01) |
| G02F 1/035 | (2006.01) |
| G02F 1/295 | (2006.01) |
| F21V 8/00 | (2006.01) |
| G02B 6/122 | (2006.01) |
| G02B 6/46 | (2006.01) |

(52) U.S. Cl.
CPC ............. G02B 6/0008 (2013.01); G02B 6/122 (2013.01); G02B 6/42 (2013.01); G02B 6/46 (2013.01); Y10T 29/4913 (2015.01)

(58) Field of Classification Search
CPC ...... G02B 6/12; G02B 6/12004; G02B 6/43; G02B 6/42; G02B 6/122; G02B 6/132; G02B 6/4202
USPC ............................ 385/2, 8, 14, 40, 129–132
See application file for complete search history.

(56) References Cited

U.S. PATENT DOCUMENTS

| 6,330,377 B1 | 12/2001 | Kosemura |
| 7,406,229 B2 | 7/2008 | Bae et al. |

(Continued)

FOREIGN PATENT DOCUMENTS

| JP | H08-110446 A | 4/1996 |
| JP | 2000-081524 A | 3/2000 |

(Continued)

OTHER PUBLICATIONS

International Search Report in International Application No. PCT/KR2011/007378, filed Oct. 5, 2011.

(Continued)

*Primary Examiner* — Kaveh C Kianni
*Assistant Examiner* — Hung Lam
(74) *Attorney, Agent, or Firm* — Saliwanchik, Lloyd & Eisenschenk

(57) ABSTRACT

Provided is an optical Printed Circuit Board (PCB). The PCB includes: an insulation layer; an optical waveguide filled in the insulation layer; and an optical device buried in the insulation layer and disposed on the same plane as the optical waveguide.

10 Claims, 4 Drawing Sheets

(56) References Cited

U.S. PATENT DOCUMENTS

| | | | |
|---|---|---|---|
| 7,630,601 B2 | 12/2009 | Mershon et al. | |
| 8,000,564 B2 | 8/2011 | Im | |
| 2005/0185880 A1* | 8/2005 | Asai | 385/14 |
| 2007/0183718 A1* | 8/2007 | Bae | G02B 6/12004 385/47 |
| 2009/0087155 A1 | 4/2009 | Watanabe | |
| 2009/0169219 A1* | 7/2009 | Nakano et al. | 398/200 |

FOREIGN PATENT DOCUMENTS

| | | |
|---|---|---|
| JP | 2002-071963 A | 3/2002 |
| JP | 2009-003096 A | 1/2009 |
| JP | 2009-086238 A | 4/2009 |
| KR | 10-2006-0053002 A | 5/2006 |
| KR | 10-2007-0080987 A | 8/2007 |
| KR | 10-0810665 B1 | 3/2008 |
| KR | 10-2010-0123019 A | 11/2010 |

OTHER PUBLICATIONS

Notice of Allowance dated Jan. 14, 2013 in Korean Application No. 10-2010-0097472, filed Oct. 6, 2010.

Office Action dated Jul. 14, 2015 in Korean Application No. 2013-532726, filed Aug. 19, 2013.

* cited by examiner

OPTICAL PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/007378, filed Oct. 5, 2011, which claims priority to Korean Application No. 10-2010-0097472, filed Oct. 6, 2010, the disclosures of each of which are incorporated herein by reference in their entirety.

TECHNICAL FIELD

The present invention relates to an optical printed circuit board and a method for manufacturing the same.

BACKGROUND ART

A Printed Circuit Board (PCB) is a component that includes integrated electrical wirings to allow various devices to be mounted or provide electrical connections between devices. As technologies are developed, PCBs having diverse forms and functions are manufactured and their examples include a Random Access Memory (RAM), a main board, and a Local Area Network (LAN) card.

In general, the PCBs are manufactured using a copper foil clad layer having a structure in which a conductive layer is stacked on an insulation member. The PCBs may be manufactured by forming a circuit pattern on the copper foil clad layer and this is called electrical PCBs. Since the electrical PCBs as a signal transmission medium use a conductive metal (for example, copper) as electrical wirings, there are limitations in transmitting high-speed and large-capacity data.

To resolve this, a PCB technique using an optical waveguide on an insulation member is developed recently. An optical fiber using polymer and glass fiber is applied to realize the optical waveguide for transmitting light in an optical PCB.

DISCLOSURE OF INVENTION

Technical Problem

Embodiments provide an optical Printed Circuit Board (PCB) having a new structure and a method of manufacturing the same.

Embodiments also provide an economical optical PCB having an excellent light transmission rate and a method of manufacturing the same.

Solution to Problem

In an embodiment, a PCB includes: an insulation layer; an optical waveguide filled in the insulation layer; and an optical device buried in the insulation layer and disposed on the same plane as the optical waveguide.

In another embodiment, a method of manufacturing an optical PCB includes: preparing a support substrate; mounting an optical device on the support substrate; forming an optical waveguide connected to the optical device on the support substrate; and forming an insulation layer to bury the optical waveguide on the support substrate.

In further another embodiment, a method of manufacturing an optical PCB includes: preparing a support substrate; forming a first insulation layer on the support substrate; forming a plurality of cavities by etching the first insulation layer; mounting a light emitting device and a light receiving device in the plurality of cavities, respectively; and forming an optical waveguide on the first insulation layer between the light emitting device and the light receiving device.

Advantageous Effects of Invention

Since optical devices are mounted in cavities and an optical waveguide and the optical devices are disposed on a virtual straight line. Therefore, optical transmission loss may be minimized to increase a light transmission rate.

Moreover, since an additional structure is not required while the optical waveguide is formed, manufacturing processes may be simplified and an economical optical PCB may be provided.

BEST MODE FOR CARRYING OUT THE INVENTION

Figure 1:
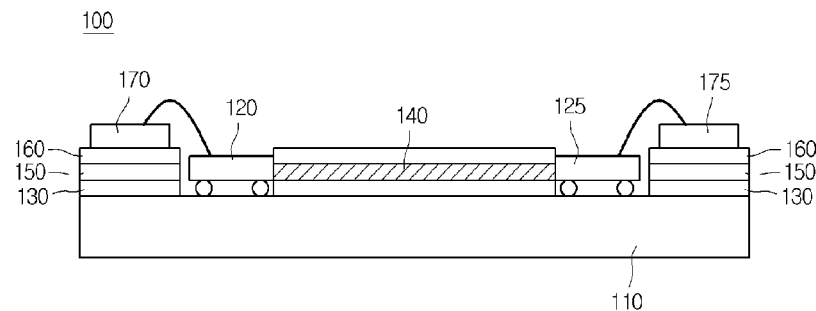
FIG. 1 is a sectional view of an optical Printed Circuit Board (PCB) according to a first embodiment of the present invention.

Hereinafter, preferred embodiments of the present invention will be described in detail with reference to the accompanying drawings in such a manner that the technical idea of the present invention may easily be carried out by a person with ordinary skill in the art to which the invention pertains. However, the present invention is realized with various different forms and is not limited to the embodiments described herein.

Furthermore, when it is described that one comprises (or includes or has) some elements, it should be understood that it may comprise (or include or has) only those elements, or it may comprise (or include or have) other elements as well as those elements if there is no specific limitation.

Moreover, in order to describe the present invention more clearly, not all elements illustrated in the drawings must be included and limited to the present invention, but the elements except essential features of the present invention may be added or deleted. Also, a dimension of each element may be exaggerated for clarity of illustration. Like reference numerals refer to like elements throughout the specification.

In the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer (or film), a region, a pattern, or a structure is referred to as being directly 'on/above/over/upper' substrate, each layer (or film), a region, a pad, or patterns, there is no intervening layer.

FIG. 1 is a sectional view of an optical Printed Circuit Board (PCB) according to a first embodiment of the present invention.

Referring to FIG. 1, the optical PCB 100 includes a support substrate 110, a light emitting device 120 and a light receiving device 125 mounted on the support substrate 110, a first insulation layer 130 on the support substrate 110, an optical waveguide 140 on the first insulation layer 130 between the light emitting device 120 and the light receiving device 125, a second insulation layer 150 on the first insulation layer 130 in an area aside from that of the optical waveguide 140, a third insulation layer 160 on the second insulation layer 150 and the optical waveguide 140, and a driver integrated circuit 170 and a receiver integrated circuit 175 on the third insulation layer 160.

The support substrate 110 forms the external appearance of the optical PCB 100 and serves as a base member providing the durability of the optical PCB 100. The support substrate 110 may have a single circuit pattern of a PCB and may be an insulation layer area having one circuit pattern (not shown) in a PCB having a plurality of stack structures.

When the support substrate 110 is one insulation layer in a plurality of stack structures, a plurality of circuit patterns (not shown) may be continuously formed on or below the support substrate 110. Additionally, a conductive via (not shown) may be formed in the support substrate 110.

The support substrate 110 may be a thermosetting or thermoplastic polymer substrate, a ceramic substrate, an organic-Inorganic composite material substrate, or a glass fiber impregnated substrate. If the support substrate 110 includes polymer resin, it may include epoxy-based insulating resin or polyimide-based resin different from that.

The light emitting device 120 and the light receiving device 125 are spaced a predetermined distance from each other on the support substrate 110. At this point, the separation interval between the light emitting device 120 and the light receiving device 125 may be determined by the width of the optical waveguide 140 formed later. More preferably, the separation interval between the light emitting device 120 and the light receiving device 125 may be identical to the width of the optical waveguide 140 and may be disposed on the support substrate 110.

The light emitting device 120 generates and outputs an optical signal and is driven by the driver integrated circuit 170.

At this point, the light emitting device 120 may include a Vertical-Cavity Surface-Emitting Laser (VCSEL), i.e., a light source device projecting an optical signal. The VCSEL is a light source device transmitting or amplifying a light source signal in a manner projecting a laser beam vertically.

The light receiving device 125 receives the light generated from the light emitting device 120 and is driven by the receiver integrated circuit 175. The light receiving device 125 may include a Photo Detector (PD), i.e., an optical signal detecting device.

The first insulation layer 130 provides a cavity where the light emitting device 120 and the light receiving device 125 are mounted. Accordingly, the first insulation layer 130 include a plurality of cavities for providing spaces where the light emitting device 120 and the light receiving device 125 are mounted.

Moreover, the thickness of the first insulation layer 130 may be determined by the height of the mounted light emitting and receiving devices 120 and 125. More preferably, the first insulation layer 130 may have a thickness for aligning the light emitting device 120, the light receiving device 125, and the optical waveguide 140 on a virtual straight line.

That is, the first insulation layer 130 provides a height difference for forming the optical waveguide 140 on the virtual straight line connecting the mounted light emitting and receiving devices 120 and 125. The height difference is provided to simultaneously align the light emitting device 120 with the optical waveguide 140, and the light receiving device 125 with the optical waveguide 140.

Since the first insulation layer 130 is formed, the optical waveguide 140 may have a form going straight between the light emitting device 120 and the light receiving device 125.

The optical waveguide 140 is formed on the first insulation layer 130. More preferably, the optical waveguide 140 may be formed on the first insulation layer 130 between the light emitting device 120 and the light receiving device 125, thereby providing a light transmission path to allow the light generated from the light emitting device 120 to be received through the light receiving device 125.

The optical waveguide 140 may include an optical fiber and also may include a polymer waveguide or ribbon type fiber besides the optical fiber.

The optical waveguide 140 according to an embodiment of the present invention may have a linear structure not a bending structure.

That is, since the optical waveguide 140 is formed between the light emitting device 120 and the light receiving device 125, which are mounted in the cavities formed by the first insulation layer 130, it may be formed with a linear structure not a bending structure. Accordingly, the optical waveguide 140 may perform a light transmission function without the loss of light generated from the light emitting device 120 and may transmit the light over the shortest distance.

An optical PCB formed with the optical waveguide 140 having a linear structure may improve a light transmission rate and have a slim thickness simultaneously.

The second insulation layer 150 is formed on the first insulation layer 130.

The second insulation layer 150 is formed on the first insulation layer 130 aside from an area of the optical waveguide 140. At this point, the second insulation layer 150 may have the same thickness as the optical waveguide 140.

The third insulation layer 160 is formed on the second insulation layer 150 and the optical waveguide 140.

The third insulation layer 160 buries the optical waveguide 140 to protect it from dangerous situation such as external impact. Moreover, the third insulation layer 160 stacked on the optical waveguide 140 may be formed of a light transmitting material.

In this way, according to an embodiment of the present invention, the first insulation layer 130 is stacked on the support substrate 110 to form a plurality of cavities and the light emitting device 120 and the light receiving device 125 are mounted in the cavities. Furthermore, since the optical waveguide 140 having a linear structure is formed between the light emitting device 120 and the light receiving device 125, components (such as minors) necessary for forming the related art optical waveguide 140 may be removed and a process (such as an etching process) necessary for forming the optical waveguide 140 may be unnecessary.

FIGS. 2 to 6 are sectional views illustrating a method of manufacturing an optical PCB according to a first embodiment of the present invention in a manufacturing order.

Referring to FIGS. 2 to 6, the method of manufacturing the optical PCB 100 of FIG. 1 will be described.

Figure 2:
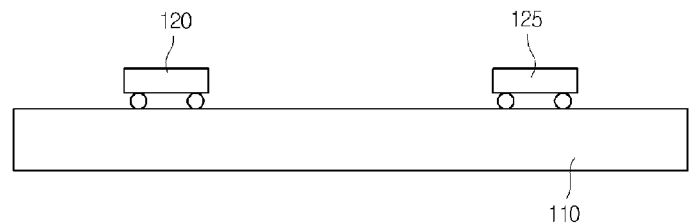
FIGS. 2 to 6 are sectional views illustrating a method of manufacturing an optical PCB according to a first embodiment of the present invention in a manufacturing order.

First, as shown in FIG. 2, the support substrate 110 is prepared and then, the light emitting device 120 and the light receiving device 125 are mounted on the support substrate 110. At this point, if the support substrate 110 is an insulation layer having a conductive layer (not shown) stacked thereon, a stack structure of the insulation layer and the conductive layer may be a typical Copper Clad Laminate (CCL).

Additionally, a pad (not shown) or a circuit pattern (not shown) formed by etching the conductive layer may be formed on the support substrate 110.

Moreover, the light emitting device 120 and the light receiving device 125 are mounted on the support substrate 110, being spaced a predetermined interval from each other. At this point, the arrangement interval between the light emitting device 120 and the light receiving device 125 may be determined by the width of the optical waveguide 140 formed later.

Figure 3:
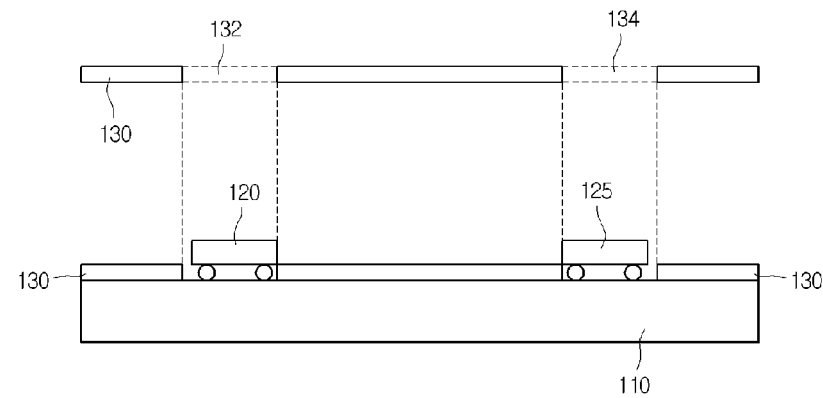

When the light emitting device 120 and the light receiving device 125 are mounted, as shown in FIG. 3, the first insulation layer 130 is stacked on the support substrate 110. At this point, the first insulation layer 130 has a first hole 132 and a second hole 134, which expose the mounted light emitting and receiving devices 120 and 125.

The first hole 132 and the second hole 134 may be formed by etching a flat insulation member.

Additionally, the positions of the first hole 132 and the second hole 134 may be determined by those of the light emitting device 120 and the light receiving device 125 mounted on the support substrate 110. The first hole 132 and the second hole 134 may be substantially used as cavities for receiving the light emitting device 120 and the light receiving device 125.

The first insulation layer 130 is formed on the support substrate 110 in areas aside from those of the light emitting device 120 and the light receiving device 125 mounted on the support substrate 110.

Moreover, the thickness of the first insulation layer 130 is determined by the height of the mounted light emitting and receiving devices 120 and 125.

That is, the first insulation layer 130 is formed to align the light emitting device 120 and the optical waveguide 140 formed later. Additionally, the first insulation layer 130 is formed to align the light receiving device 125 and the optical waveguide 140. Accordingly, the first insulation layer 130 is formed with a predetermined thickness for forming the optical waveguide 140 on a virtual straight line connecting the mounted light emitting device 120 and the receiving device 125.

Figure 4:
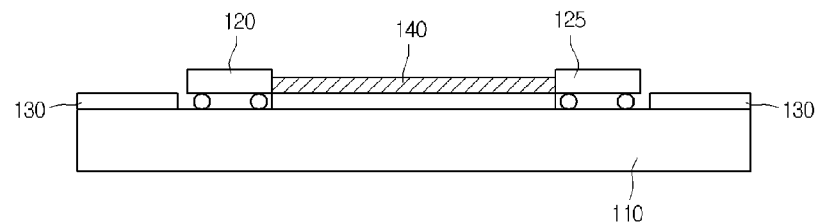

Referring to FIG. 4, when the first insulation layer 130 is stacked, the optical waveguide 140 is formed on the stacked first insulation layer 130.

At this point, the optical waveguide 140 having a linear structure is formed on the first insulation layer 130 between the light emitting device 120 and the light emitting device 125. That is, the optical waveguide 140 is formed with a structure going straight between the light emitting device 120 and the light emitting device 125.

Figure 5:
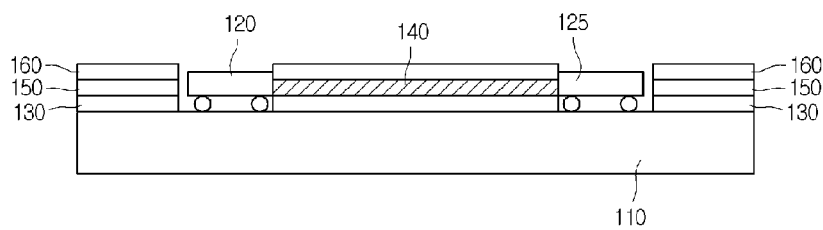

Referring to FIG. 5, when the optical waveguide 140 is formed, the second insulation layer 150 and the third insulation layer 160 are sequentially formed on the first insulation layer 130 and the optical waveguide 140.

The second insulation layer 150 and the third insulation layer 160 are stacked through pressure molding. That is, an insulation member constituting the second and third insulation layers 150 and 160 becomes an adhesive material in a melting state when heat and pressure are applied. Moreover, as the insulation member is cooled, it becomes hardened again, so that the second insulation layer 150 stacked on the first insulation layer 130 and the third insulation layer 160 stacked on the second insulation layer 150 and the optical waveguide 140 are formed.

The third insulation layer 160 buries the optical waveguide 140 between the first insulation layers 130 to protect it from the external.

Moreover, the second insulation layer 150 has the same thickness as the optical waveguide 140. That is, the second insulation layer 150 is formed on the first insulation layer 130 in an area aside from that of the optical waveguide 140. That is, the second insulation layer 150 is formed on the first insulation layer 130 with the same thickness as the optical waveguide 140, in order to obtain uniform thickness.

Figure 6:
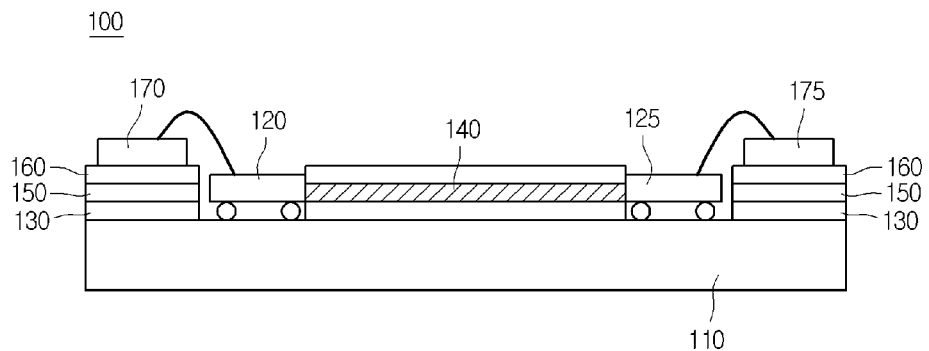

When the second insulation layer 150 and the third insulation layer 160 are stacked, as shown in FIG. 6, the driver integrated circuit 170 and the receiver integrated circuit 175 are mounted on the third insulation layer 160.

At this point, the driver integrated circuit 170 and the receiver integrated circuit 175 are electrically connected to the light emitting device 120 and the light receiving device 125, respectively, through wire boning. Additionally, the driver integrated circuit 170 and the receiver integrated circuit 175 may be electrically connected to a substrate through wire bonding. Moreover, when the driver integrated circuit 170 and the receiver integrated circuit 175 have bumps, they may be formed on the third insulation layer 160 through flip chip bonding.

As mentioned above, since a light emitting device and a light receiving device are mounted in cavities and an optical waveguide is formed on a virtual straight line connecting the light emitting device and the light receiving device, optical transmission loss may be effectively prevented.

Figure 7:
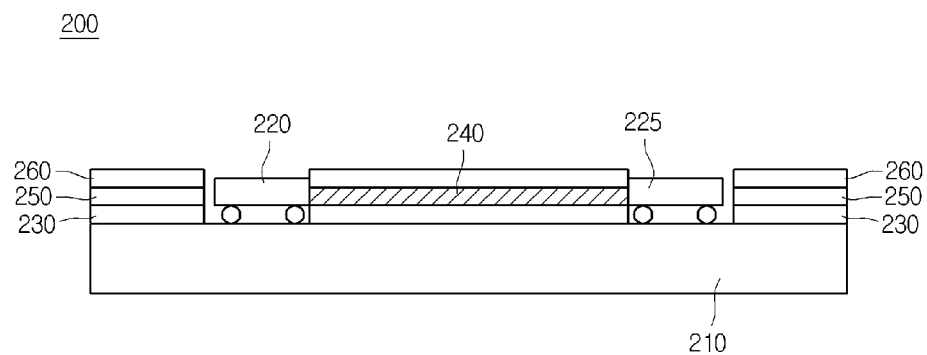
FIG. 7 is a sectional view of an optical PCB according to a second embodiment of the present invention.

FIG. 7 is a sectional view of an optical PCB according to a second embodiment of the present invention.

Overall features of the optical PCB 200 shown in FIG. 7 are identical to those of the PCB 100 according to the first embodiment of the present invention, except for devices mounted in cavities. For concise description, overlapping descriptions relating to the optical PCB 200 according to the second embodiment and the PCB 100 according to the first embodiment will be omitted.

Referring to FIG. 7, the optical PCB 200 includes a support substrate 210, an optical transmission module 220 and an optical reception module 225 mounted on the support substrate 210, a first insulation layer 230 on the support substrate 210, an optical waveguide 240 on the first insulation layer 230 between the optical transmission module 220 and the optical reception module 225, a second insulation layer 250 on the first insulation layer 230 in an area aside from that of the optical waveguide 240, and a third insulation layer 260 on the second insulation layer 250 and the optical waveguide 240.

In the optical PCB 200, an optical device and an integrated circuit are configured as one package so that they are mounted in cavities formed by the first insulation layer 230.

That is, the optical transmission module 220 where a light emitting device and a driver integrated circuit are packaged and the optical reception module 225 where the light receiving device and a receiver integrated circuit are packaged are mounted in the cavities formed by the first insulation layer 230.

Thus, according to the optical PCB 200, since the optical transmission module 220 where a light emitting device and a driver integrated circuit are packaged and the optical reception module 225 where the light receiving device and a receiver integrated circuit are packaged are mounted in the cavities formed by the first insulation layer 230, the optical PCB 200 may be slim and additional processes for mounting the driver integrated circuit and the receiver integrated circuit may be omitted.

Figure 8:
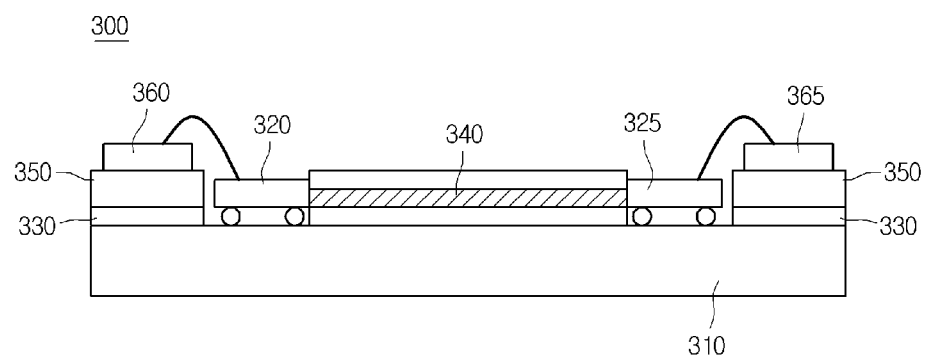
FIG. 8 is a sectional view of an optical PCB according to a third embodiment of the present invention.

FIG. 8 is a sectional view of an optical PCB according to a third embodiment of the present invention.

Referring to FIG. 8, the optical PCB 300 includes a support substrate 310, a light emitting device 320 and a light receiving device 325 mounted on the support substrate 310, a first insulation layer 330 on the support substrate 310, an optical waveguide 340 on the first insulation layer 330 between the light emitting device 320 and the light receiving device 325, a second insulation layer 350 on the first insulation layer 330 and the optical waveguide 340, and a driver integrated circuit 360 and a receiver integrated circuit 365 on the second insulation layer 350.

An overall structure of the optical PCB 300 is identical to that of the optical PCB 100 according to the first embodiment of the present invention. However, according to the optical PCB 100 according to the first embodiment, the second insulation layer 150 and the third insulation layer 160 are sequentially stacked after the optical waveguide 140 is formed. However, according to the optical PCB 300 according to the third embodiment, the second insulation layer 350 is stacked after the optical waveguide 340 is formed.

In the optical PCB 300, after the optical waveguide 340 is formed, the second insulation layer 360 is stacked on the optical waveguide 340 and on the first insulation layer 330 in an area aside from that of the optical waveguide 340.

The second insulation layer 360 may be formed by etching a flat insulation material.

That is, the flat insulation member is half-etched in an area corresponding to the optical waveguide 340 and the half-etched flat insulation member may be selectively stacked on the optical waveguide 340 and the first insulation layer 330.

Additionally, the flat insulation member is stacked on the first insulation layer 330 and the optical waveguide 340 to form the second insulation layer 350 and a desmear process is performed on the second insulation layer 350 on the optical waveguide 340. As a result, the second insulation layer 350 of FIG. 7 is finally formed.

Figure 9:
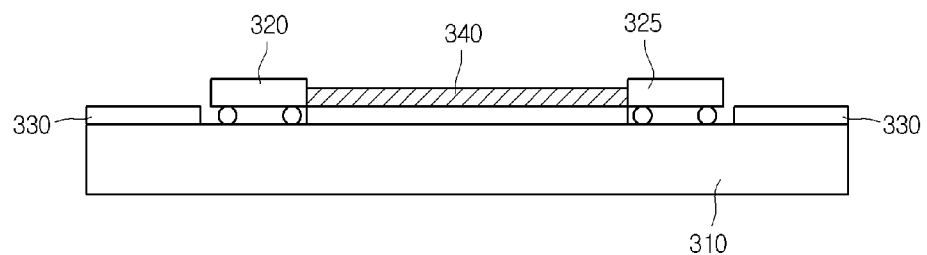
FIGS. 9 to 11 are sectional views illustrating a method of manufacturing an optical PCB according to a third embodiment of the present invention in a manufacturing order.
Figure 10:
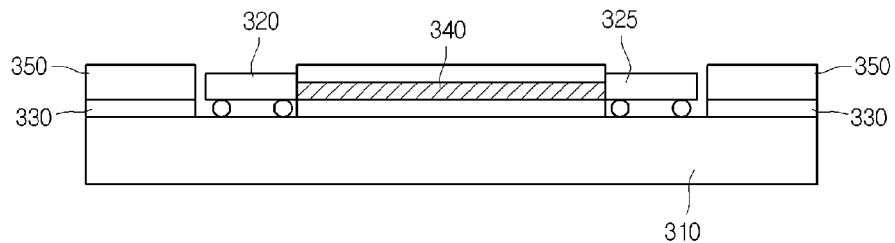
Figure 11:
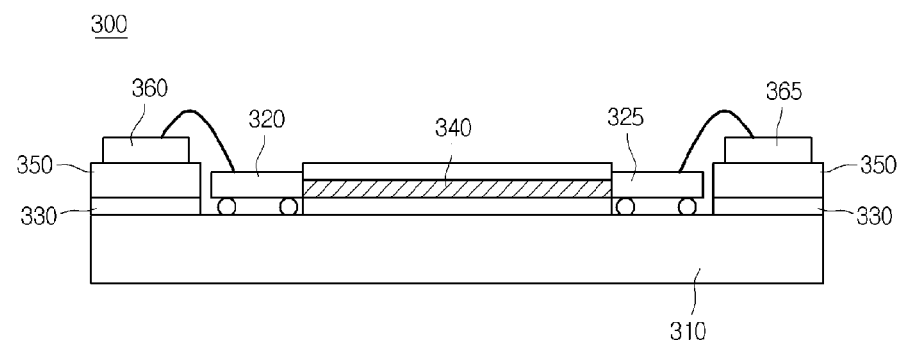

FIGS. 9 to 11 are sectional views illustrating a method of manufacturing an optical PCB according to a third embodiment of the present invention in a manufacturing order.

Referring to FIG. 9, like the method according to the first embodiment, the method according to third embodiment includes preparing the support substrate 310, and mounting the light emitting device 320 and the light receiving device 325 on the support substrate 310. At this point, the light emitting device 320 and the light receiving device 325 are mounted being spaced a predetermined distance apart from each other in consideration of the width of the optical waveguide 340.

Once the light emitting device 320 and the light receiving device 325 are mounted, the first insulation layer 330 is formed on the support substrate 310 to expose the light emitting device 320 and the light receiving device 325.

After the first insulation layer 330 is formed, the optical waveguide 340 is formed on the first insulation layer 330 between the light emitting device 320 and the light receiving device 325. At this point, the optical waveguide 340 is formed being aligned with the light emitting device 320 and the light receiving device 325. That is, the optical waveguide 340 is formed with a linear structure on a virtual straight line connecting the light emitting device 320 and the light receiving device 325.

Referring to FIG. 10, after the optical waveguide 340 is formed, the second insulation layer 350 is stacked on the first insulation layer 330 and the optical waveguide 340 to protect the optical waveguide 340. At this point, the second insulation layer 350 may be formed of an insulation member etched in correspondence to the shape of the optical waveguide 340 and may be formed of a flat insulation member. The second insulation layer 350 in an unnecessary area is removed through a desmear process after it is formed.

Referring to FIG. 11, when the second insulation layer 350 is formed, the driver integrated circuit 360 and the receiver integrated circuit 365 are mounted on the second insulation layer 350.

Figure 12:
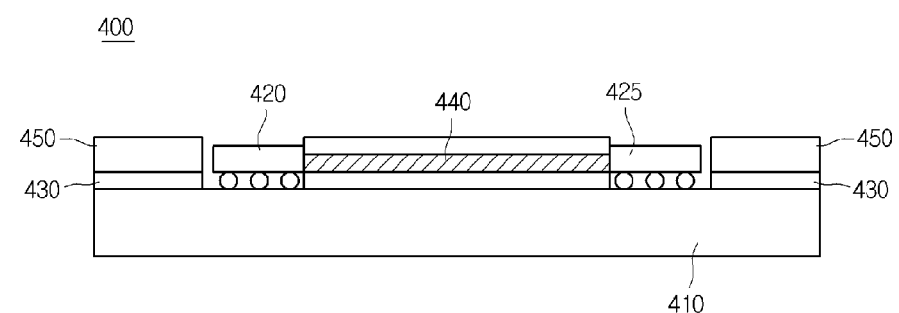
FIG. 12 is a sectional view of an optical PCB according to a fourth embodiment of the present invention.

FIG. 12 is a sectional view of an optical PCB according to a fourth embodiment of the present invention.

Like the optical PCB 200 according to the second embodiment, the optical PCB 400 according to the fourth embodiment is identical to the optical PCB 300 according to the third embodiment, except for devices mounted in cavities.

That is, according to the optical PCB 400, an optical device and an integrated circuit are configured as one package and are mounted in the cavities formed by the first insulation layer 430. That is, the optical transmission module 420 where a light emitting device and a driver integrated circuit are packaged and the optical receiving module 425 where a light receiving device and a receiver integrated circuit are packaged are mounted in the cavities formed by the first insulation layer 430.

FIGS. 13 to 17 are sectional views illustrating a method of manufacturing an optical PCB according to a fifth embodiment of the present invention in a manufacturing order.

At this point, the PCB 500 manufactured through the method of manufacturing an optical PCB according to the fifth embodiment has the same structure as the optical PCB 100 according to the first embodiment.

Figure 13:
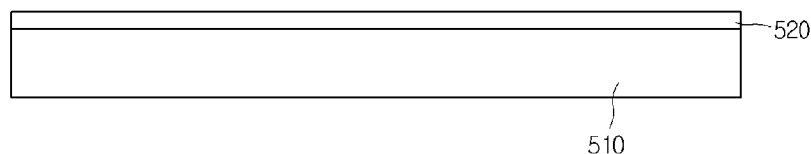
FIGS. 13 to 17 are sectional views illustrating a method of manufacturing an optical PCB according to a fifth embodiment of the present invention in a manufacturing order.

Referring to FIG. 13, a support substrate 510 is prepared first and then a first insulation layer 520 is stacked on the support substrate 510. The second insulation layer 520 may be formed on the support substrate 510 through thermal compression.

Figure 14:
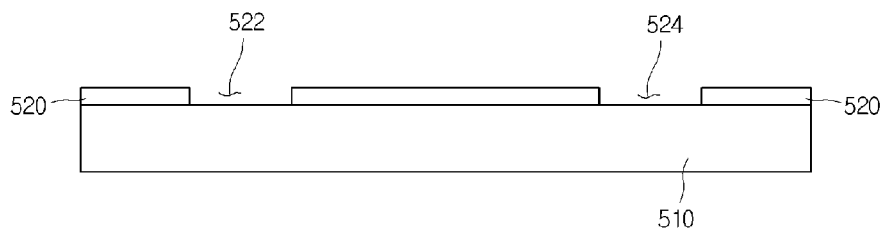

Referring to FIG. 14, a plurality of cavities 522 and 524 for mounting optical devices are formed by etching the first insulation layer 520 stacked on the support substrate 510. At this point, the plurality of cavities 522 and 524 include the first cavity 522 and the second cavity 524. The first cavity 522 is used as a mounting space of a light emitting device and the second cavity 524 is used as a mounting space of a light receiving device.

The plurality of cavities 522 and 524 may be formed through stack, exposure, development, etching, and delaminating process of a typical dry film. At this point, the plurality of cavities 522 and 524 may be formed in consideration of the length of the optical waveguide 540 formed later. That is, the separation distance between the first cavity 522 and the second cavity 524 may be formed in correspondence to the width of the optical waveguide 540.

Figure 15:
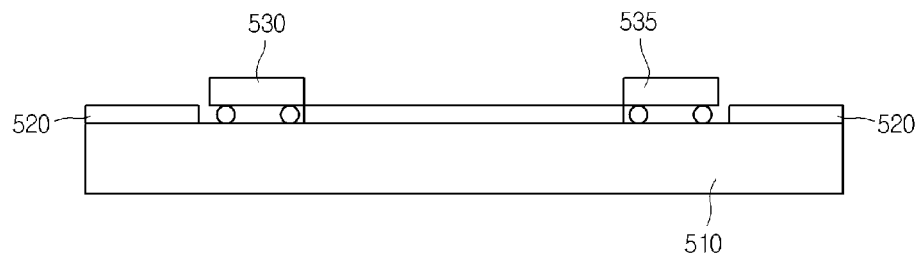

When the plurality of cavities 522 and 524 are formed in the first insulation layer 520, as shown in FIG. 15, the light emitting device 530 is mounted in the first cavity 522 and the light receiving device 535 is mounted in the second cavity 524.

Figure 16:
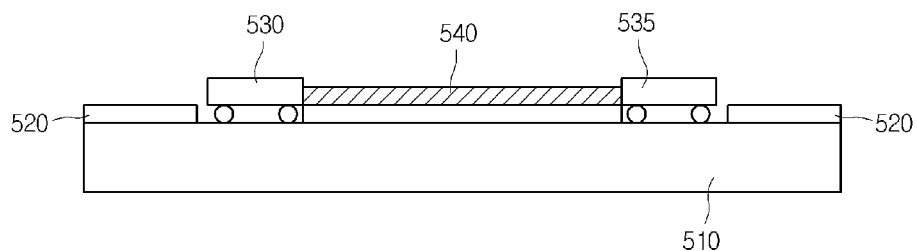

When the light emitting device 530 and the light receiving device 535 are mounted, as shown in FIG. 16, the optical waveguide 540 is formed on the first insulation layer 520 between the light emitting device 530 and the light receiving device 535.

Figure 17:
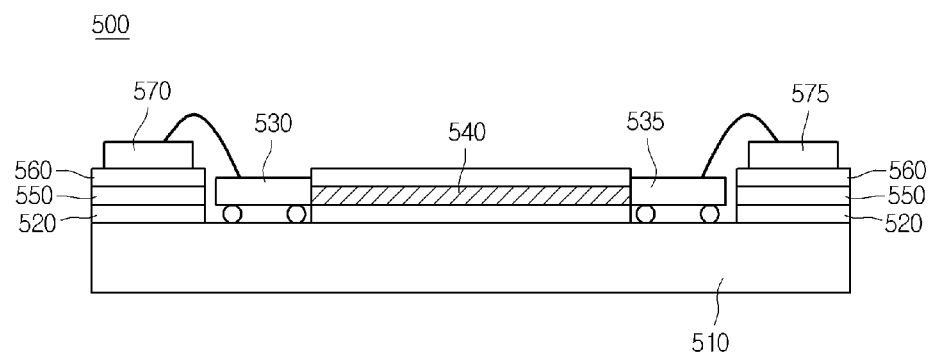

Later, as shown in FIG. 17, a second insulation layer 550 is stacked on the first insulation layer 520 in an area aside from that of the optical waveguide 540, and a third insulation layer 560 is stacked on the stacked second insulation layer 550 and the optical waveguide 540. Moreover, a driver integrated circuit 570 and a receiver integrated circuit 575 are mounted on the third insulation layer 560.

As mentioned above, according to the optical PCB according to the embodiments of the present invention, since optical devices are mounted in cavities and an optical waveguide and the optical devices are disposed on a virtual straight line. Therefore, optical transmission loss may be minimized to increase a light transmission rate.

Moreover, since an additional structure is not required while the optical waveguide is formed, manufacturing processes may be simplified and an economical optical PCB may be provided.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An optical Printed Circuit Board (PCB) comprising:
   a support substrate;
   an insulation layer on the support substrate and having a first cavity and a second cavity;
   an optical waveguide filled in the insulation layer, the optical waveguide being disposed between the first cavity and the second cavity;
   a light emitting device disposed in the first cavity, directly contacting a first side surface of the optical waveguide and outputting an optical signal through the contacted first side surface; and
   a light receiving device disposed in the second cavity, directly contacting a second side surface of the optical waveguide and receiving the optical signal transmitted through the contacted second side surface;
   wherein a side surface of the light emitting device is aligned with the first side surface of the optical waveguide in a first vertical line, and a side surface of the light receiving device is aligned with the second side surface of the optical waveguide in a second vertical line;
   wherein the side surface of the light emitting device is in contact with the first side surface of the optical waveguide, and the side surface of the light receiving device is in contact with the second side surface of the optical waveguide;
   wherein the support substrate is divided into a first region, a second region, and a third region between the first region and the second region;
   wherein the insulation layer comprises:
   a first insulation layer disposed on the first region, the second region, and the third region;
   a second insulation layer disposed on portions of the first insulation layer disposed on the first region and the second region; and
   a third insulation layer disposed on the second insulation layer and the optical waveguide:
   wherein the optical waveguide is disposed on a portion of the first insulation layer on the third region, and
   wherein the second insulation layer has a thickness same as that of the optical waveguide.

2. The optical PCB according to claim 1,
   wherein the first side surface is exposed through the first cavity, and the second side surface is exposed through the second cavity; and
   wherein the light emitting device and light receiving device are directly in contact with the first and second side surfaces of the optical wave guide, respectively.

3. The optical PCB according to claim 1, wherein the optical waveguide is disposed on a virtual straight line connecting the light emitting device and the light receiving device.

4. The optical PCB according to claim 1, further comprising an integrated circuit disposed in at least one of the first and second cavities.

5. A method of manufacturing an optical PCB, the method comprising:
   preparing a support substrate;
   mounting a light emitting device and a light receiving device on the support substrate;
   forming a first insulation layer exposing the light emitting device and the light receiving device on the support substrate; and
   forming an optical waveguide on the first insulation layer and formed between the light emitting device and the light receiving device;
   wherein a first side surface of the optical waveguide is in direct contact with a side surface of the light emitting device and a second side surface of the optical waveguide is in direct contact with a side surface of the light receiving device, wherein the optical waveguide receives an optical signal outputted through the contacted side surface of the light emitting device and transmits the optical signal to the contacted side surface of the light receiving device;
   wherein a side surface of the light emitting device is aligned with the first side surface of the optical waveguide in a first vertical line, and a side surface of the light receiving device is aligned with the second side surface of the optical waveguide in a second vertical line;
   wherein the side surface of the light emitting device is in contact with the first side surface of the optical waveguide, and the side surface of the light receiving device is in contact with the second side surface of the optical waveguide;
   wherein the support substrate is divided into a first region, a second region, and a third region between the first region and the second region;
   wherein a second insulation layer is disposed on portions of the first insulation layer on the first region and the second region;

wherein a third insulation layer is disposed on the second insulation layer and the optical waveguide;

wherein the optical waveguide is disposed on a portion of the first insulation layer on the third region; and wherein the second insulation layer has a thickness same as that of the optical waveguide.

6. The method according to claim 5, wherein the mounting of the light emitting device and the light receiving device comprises:

mounting the light emitting device on the support substrate; and mounting the light receiving device spaced apart at a predetermined distance from the light emitting device on the support substrate.

7. The method according to claim 5, wherein the forming of the optical waveguide comprises forming the optical waveguide on a virtual straight line connecting the light emitting device and the light receiving device.

8. The method according to claim 5, further comprises: performing a de-smear process on the formed third insulation layer.

9. A method of manufacturing an optical PCB, the method comprising:

preparing a support substrate;

forming a first insulation layer on the support substrate;

forming a plurality of cavities by etching the first insulation layer;

disposing a light emitting device and a light receiving device in the plurality of cavities, respectively; and forming an optical waveguide on the first insulation layer between the light emitting device and the light receiving device;

wherein a first side surface of the optical waveguide is in direct contact with a side surface of the light emitting device and a second side surface of the optical waveguide is in direct contact with a side surface of the light receiving device;

wherein the optical waveguide receives an optical signal outputted through the contacted side surface of the light emitting device and transmits the optical signal to the contacted side surface of the light receiving device;

wherein the light emitting device includes an emitting laser and the light receiving device includes a photo detector;

wherein a side surface of the emitting laser is aligned with the first side surface of the optical waveguide in a first vertical line, and a side surface of the photo detector is aligned with the second side surface of the optical waveguide in a second vertical line;

wherein the side surface of the emitting laser is in contact with the first side surface of the optical waveguide, and the side surface of the photo detector is in contact with the second side surface of the optical waveguide;

wherein the support substrate is divided into a first region, a second region, and a third region between the first region and the second region;

wherein a second insulation layer is disposed on portions of the first insulation layer on the first region and the second region;

wherein a third insulation layer is disposed on the second insulation layer and the optical waveguide;

wherein the optical waveguide is disposed on a portion of the first insulation layer of the third region; and wherein the second insulation layer has a thickness same as that of the optical waveguide.

10. The method according to claim 9, wherein the first insulation layer is configured to have a thickness such that the light emitting device, the light receiving device, and the optical waveguide are aligned on a virtual straight line.

\* \* \* \* \*